(12) United States Patent
Zhou et al.

(10) Patent No.: US 12,366,587 B2
(45) Date of Patent: Jul. 22, 2025

(54) ACCELERATION SENSOR AND METHOD OF MAKING THE SAME

(71) Applicant: Chongqing University, Chongqing (CN)

(72) Inventors: Xiaoping Zhou, Chongqing (CN); Ping Chen, Chongqing (CN); Zhi Zhao, Chongqing (CN); Junwei Chen, Chongqing (CN); Zheyu Yang, Chongqing (CN)

(73) Assignee: CHONGQING UNIVERSITY, Chongqing (CN)

( * ) Notice: Subject to any disclaimer, the term of this patent is extended or adjusted under 35 U.S.C. 154(b) by 288 days.

(21) Appl. No.: 18/205,558

(22) Filed: Jun. 4, 2023

(65) Prior Publication Data
US 2024/0230704 A1 Jul. 11, 2024

(30) Foreign Application Priority Data
Jan. 5, 2023 (CN) .......................... 202310010795.3

(51) Int. Cl.
*G01P 15/12* (2006.01)
*B81B 3/00* (2006.01)
*G01P 15/00* (2006.01)

(52) U.S. Cl.
CPC .......... *G01P 15/006* (2013.01); *B81B 3/0021* (2013.01); *G01P 15/12* (2013.01); *B81B 2201/0235* (2013.01)

(58) Field of Classification Search
CPC ...... G01P 15/006; G01P 15/12; B81B 3/0021; B81B 2201/0235
See application file for complete search history.

(56) References Cited

U.S. PATENT DOCUMENTS 11,391,751 B2 * 7/2022 Zimmermann ....... G01P 15/006
11,874,158 B2 * 1/2024 Xu ........................ G01P 15/006

* cited by examiner

*Primary Examiner* — Xin Y Zhong
(74) *Attorney, Agent, or Firm* — MATTHIAS SCHOLL P.C.; Matthias Scholl

(57) ABSTRACT

An acceleration sensor includes an upper base plate; a lower base plate; and a gallium-based liquid metal encapsulated in graphene. The lower base plate includes a first surface including at least one diamond channel, and the upper base plate includes a second surface including a metal electrode corresponding to the at least one diamond channel in position; the liquid metal is disposed in a center of the at least one diamond channel; the first surface is bonded to the second surface through an adhesive; the liquid metal is movable in the at least one diamond channel and is in electrical contact with the metal electrode of the upper base plate during movement.

6 Claims, 4 Drawing Sheets

ACCELERATION SENSOR AND METHOD OF MAKING THE SAME

CROSS-REFERENCE TO RELATED APPLICATIONS

Pursuant to 35 U.S.C. § 119 and the Paris Convention Treaty, this application claims foreign priority to Chinese Patent Application No. 202310010795.3 filed Jan. 5, 2023, the contents of which, including any intervening amendments thereto, are incorporated herein by reference. Inquiries from the public to applicants or assignees concerning this document or the related applications should be directed to: Matthias Scholl P.C., Attn.: Dr. Matthias Scholl Esq., 245 First Street, 18th Floor, Cambridge, MA 02142.

BACKGROUND

The disclosure relates to an acceleration sensor and a method of making the same. The acceleration sensor is capable of measuring biaxial acceleration and monitoring the vibration acceleration of rock mass during excavation and blasting in tunnels and underground chambers.

Acceleration sensors are widely used as explosive vibration detection devices in fields such as mining, large buildings, flood control dams, petroleum exploration, and civil engineering. In recent years, with the rapid development of the micro-electro-mechanical system (MEMS) and wireless sensor technology, MEMS wireless sensors have been applied in geological detection and engineering monitoring fields. MEMS acceleration sensors can monitor the vibration acceleration of particles at the tunnel floor during the blasting process.

MEMS acceleration sensors can be divided into solid state inertial MEMS acceleration sensors and non-solid state inertial MEMS acceleration sensors based on the state of the inertial mass block. The solid state inertial MEMS acceleration sensors have the following disadvantages: the surface micromachining of various parts is defective; the customized assembly process cost of devices is high; the signal processing steps are complex, and the manufacturing of inertia mass blocks is complex, which may cause mechanical fatigue.

The liquid metal used in non-solid inertial MEMS acceleration sensors is metal or alloy materials with relatively low melting points and can maintain a liquid state at room temperature and pressure. Mercury is widely used. However, mercury acceleration sensors still have the following problems: 1. Mercury is toxic. When mercury is used as electrode and sensing element, there are potential safety hazards and environmental hazard in the manufacturing, installation and use of the acceleration sensor. 2. The acceleration sensor only measures acceleration along one axis.

SUMMARY

To achieve the aforesaid objective, one objective of the disclosure is to provide an acceleration sensor comprising a non-toxic, non-viscous, non-corrosive, and high electronic conductive liquid metal. The acceleration sensor is capable of measuring biaxial acceleration and monitoring the vibration acceleration of rock mass during excavation and blasting in tunnels and underground chambers.

The acceleration sensor comprises an upper base plate; a lower base plate; and a gallium-based liquid metal encapsulated in graphene. The lower base plate comprises a first surface comprising at least one diamond channel, and the upper base plate comprises a second surface comprising a metal electrode corresponding to the at least one diamond channel in position; the liquid metal is disposed in a center of the at least one diamond channel; the first surface is bonded to the second surface through an adhesive; the liquid metal is movable in the at least one diamond channel and is in electrical contact with the metal electrode of the upper base plate during movement.

The liquid metal is non-toxic, non-viscous, non-corrosive, and high electronic conductive, so that the acceleration sensor uses gallium based droplets encapsulated in highly conductive graphene as inertial bodies, avoiding potential safety hazards.

In a class of this embodiment, the lower base plate comprises two diamond channels arranged in a cross pattern, and the upper base plate comprises four metal electrodes distributed along a cross line of the cross pattern.

In a class of this embodiment, the lower base plate is an acrylic plate, the upper base plate is borosilicate glass, and the metal electrode is a symmetrical zigzag nickel chromium conductive layer.

The design makes the acceleration sensor can achieve the biaxial measurement of the acceleration.

In another aspect, the disclosure provides a method for manufacturing the acceleration sensor, the method comprising:

1) preparing the upper base plate and the lower upper base plate;
2) forming diamond channels on the lower base plate through deep reactive ion etching, modifying a surface of the diamond channels using a sandblasting system to form a serrated micro convex structure on side walls of the diamond channels; depositing a chromium layer as an adhesive layer on a glass base plate using an electron beam evaporator, depositing a nickel layer on the chromium layer; with a photoresist as an etching mask, etching the nickel layer and the chromium layer using a wet etchant to obtain a nickel chromium alloy electrode;
3) placing the liquid metal 5 encapsulated in graphene in the center of the diamond channels, and bonding the upper base plate and the lower base plate using a curable adhesive, to produce the acceleration sensor; and
4) testing the acceleration sensor, and calibrating an acceleration value of the acceleration sensor.

The following advantages are associated with the acceleration sensor of the disclosure:

1. The acceleration sensor comprises a non-toxic, non-viscous, non-corrosive, and high electronic conductive liquid metal, thus avoiding potential safety hazards when using mercury as electrodes and sensitive components.
2. The biaxial acceleration sensor adopts four nickel chromium alloy electrodes thus achieving biaxial measurement of acceleration.

Figure 1:
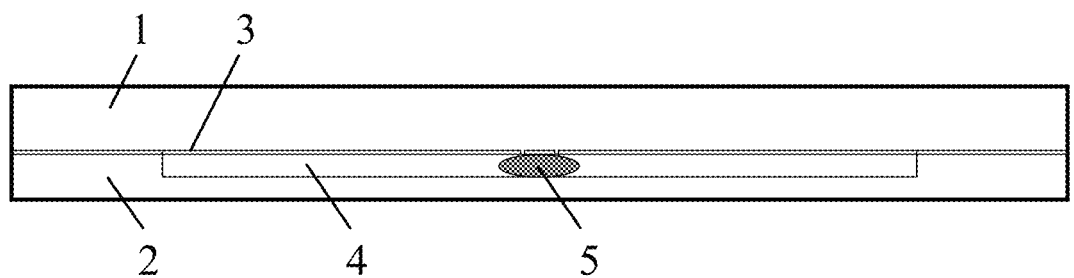
FIG. 1 is a schematic diagram of an acceleration sensor according to one example of the disclosure.

In the drawings, the following reference numbers are used: 1. Upper base plate; 2. Lower base plate; 3. Metal electrode; 4. Diamond channel; 5. Gallium-based liquid metal.

DETAILED DESCRIPTION

To further illustrate the disclosure, embodiments detailing an acceleration sensor are described below. It should be noted that the following embodiments are intended to describe and not to limit the disclosure.

As shown in FIG. 1, an acceleration sensor of the disclosure comprises an upper base plate 1; a lower base plate 2; and a gallium-based liquid metal 5 encapsulated in graphene (liquid metal for short hereinafter). The lower base plate 2 comprises a first surface comprising at least one diamond channel 4. The diamond channel 4 can increase the surface tension of the liquid metal droplets, thereby achieving force balance. The surface of the diamond channel is modified using a sandblasting system to form a serrated micro convex structure on side walls of the diamond channel, thus improving the non-wetting performance of the liquid metal 5. The upper base plate 1 comprises a second surface comprising a metal electrode 3 corresponding to the at least one diamond channel in position; the liquid metal 5 is disposed in a center of the at least one diamond channel 4; the first surface is bonded to the second surface through an adhesive; the liquid metal 5 is movable in the at least one diamond channel 4 and is in electrical contact with the metal electrode 3 of the upper base plate during movement.

Figure 2:
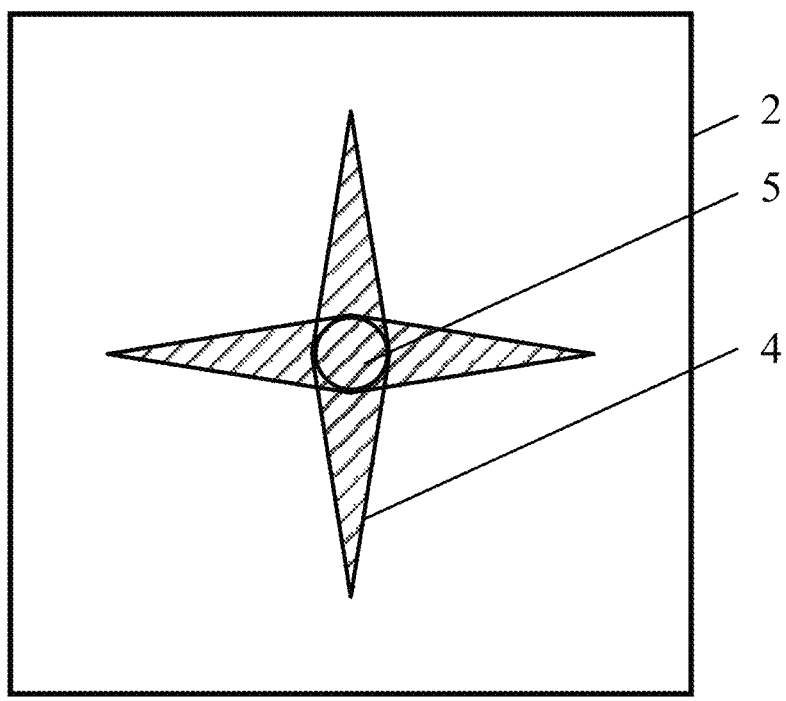
FIG. 2 is a schematic diagram of a lower base plate in FIG. 1.

As shown in FIG. 2, the lower base plate 2 comprises two diamond channels 4 arranged in a cross pattern.

Figure 3:
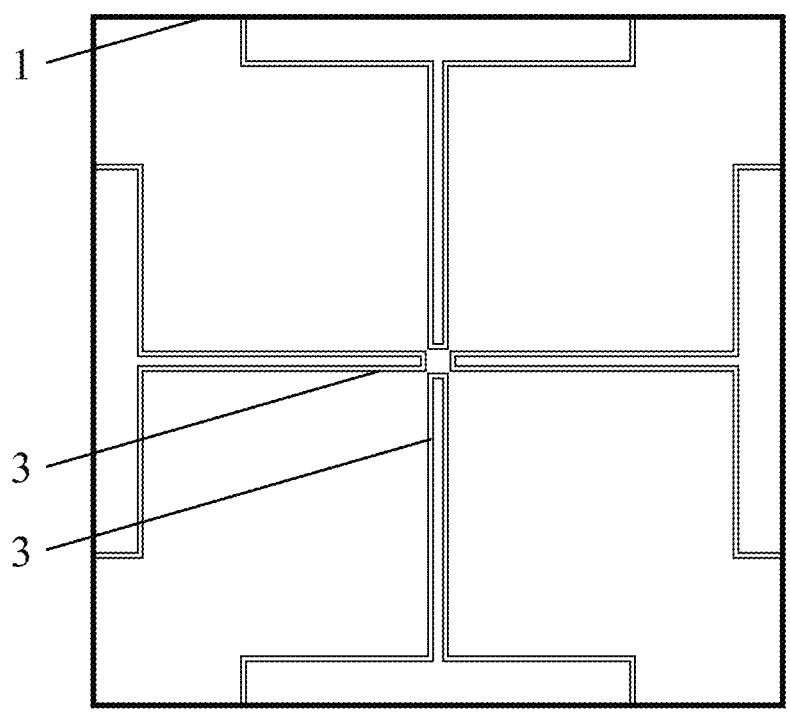
FIG. 3 is a schematic diagram of an upper base plate in FIG. 1.

As shown in FIG. 3, the upper base plate 1 comprises four metal electrodes 3 distributed along the cross line of the cross pattern of the two diamond channels 4.

The four metal electrodes 3 are arranged in a cross pattern, so that the acceleration sensor of the disclosure can achieve the biaxial measurement of the acceleration.

The lower base plate 2 is acrylic board (polymethyl methacrylate PMMA), which is a colorless transparent glass-like material with a density of 1.19 g/cm³, high strength, and has a tensile and impact resistance 7 to 18 times higher than ordinary glass, good stability, and chemical corrosion resistance.

The upper base plate 1 is borosilicate glass, with basic components comprising $SiO_2$, $B_2O_3$, and $Na_2O$. The range of the components is: ω (SiO2)=70%-80%, ω (B2O3)=6%-15%, ω (Na2O)=4%-10%, ω (Al2O3)=0-5%, ω (BaO)=0-2%, ω (CaO)=0-2%. The upper base plate has a low coefficient of thermal expansion, good heat resistance and high surface hardness.

As shown in FIG. 3, the metal electrode 3 is a symmetrical zigzag nickel chromium conductive layer. Specifically, a chromium layer is deposited as an adhesive layer on a glass base plate using an electron beam evaporator, and a nickel layer is deposited on the chromium layer; with a photoresist as an etching mask, the nickel layer and the chromium layer are etched using a wet etchant to obtain a nickel chromium alloy electrode.

The working principle of the acceleration sensor comprising non-toxic liquid metal is as follows.

The liquid metal of the disclosure is placed in the diamond channel on the lower base plate. The diamond channel is configured to restrict the movement of the liquid metal droplet and guide it when an acceleration is applied.

Figure 4:
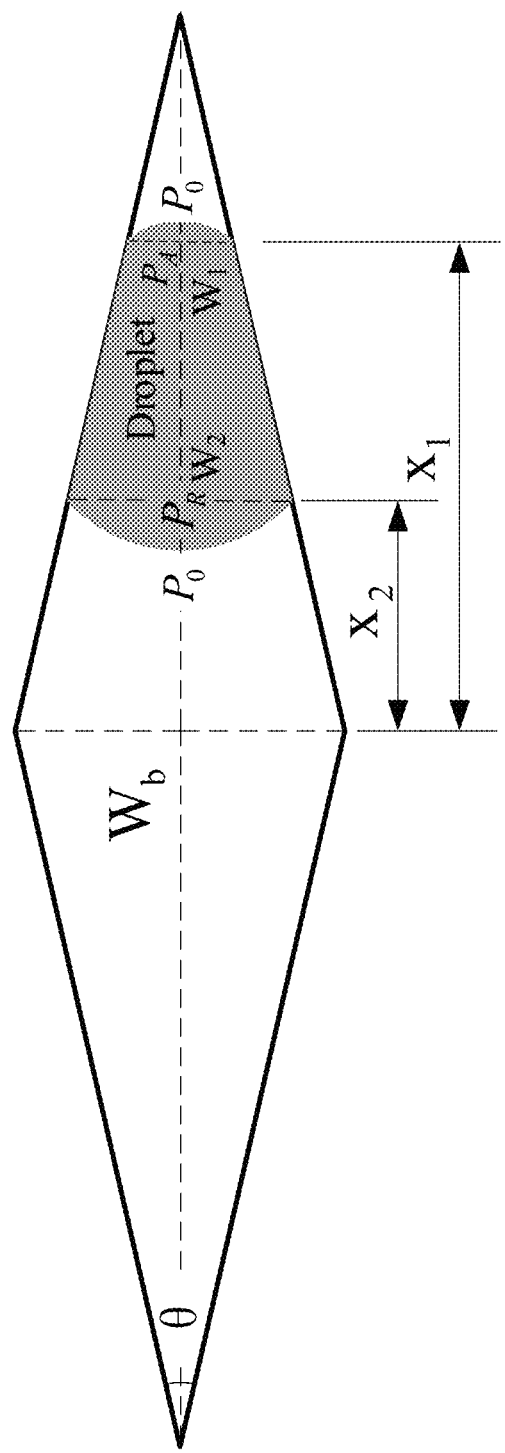
FIG. 4 is a planar structure diagram of a diamond channel of the disclosure.
Figure 5:
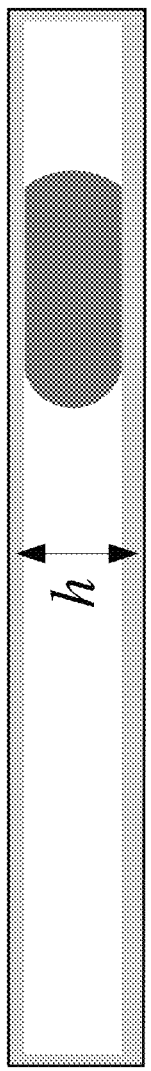
FIG. 5 is a vertical structure diagram of a diamond channel of the disclosure.

When no acceleration is applied (at initial state), owing to the surface tension, the liquid metal droplet remains at the center of the diamond channel. When acceleration is applied, the applied acceleration will generate inertial force on the liquid metal droplet, causing the liquid metal droplet to move towards one end of the diamond channel, and the movement will be resisted by the surface tension in the opposite direction. When these forces are equal and opposite in directions, the liquid metal droplet will eventually stop moving, and the final position of the liquid metal droplet is recorded to calculate the acceleration:

$$a = \frac{F}{m} = \frac{\Delta P W_1 h}{\rho V};$$

a represents acceleration. As shown in FIGS. 4 and 5, $\Delta P$ is the difference between the front surface pressure $P_A$ and the rear surface pressure $P_R$ of the liquid metal, $W_1$ is the distance between the two walls of the diamond channel in contact with the front surface of the liquid metal droplet, and h is the height of the diamond channel, ρ is the density of tje liquid metal, and V is the volume of the liquid metal droplet. The final position $X_1$ of the liquid metal droplet can be calculated by the side wall distance $W_1$ of the variable cross-section of the diamond.

After the testing, the surface tension of the liquid metal droplet will cause it to move back towards the center of the diamond channel and return to its initial spherical state for the next measurement.

The metal electrode on the upper substrate adopts a nickel chromium alloy electrode, which has a high resistance value. According to the law of resistance, this resistance is proportional to the length (L) of the metal electrode and inversely proportional to the cross-sectional area (A). For the acceleration sensor of the discourse, the cross-sectional area (A) of the metal electrode is constant, but the electrode length (L) is variable subject to the position of the liquid metal droplet. If the liquid metal droplet moves to the right and the length of the right electrode decreases, then the right resistance decreases. Because the liquid metal encapsulated in graphene connects the parallel double wires of the metal electrode, causing a short circuit along the metal electrode and shortening the length of the metal electrode. The relationship of the changes between acceleration a and resistance $\Delta R$ is as follows:

$$a = \frac{\Delta P W_1 h}{V x_1} S \Delta R.$$

The formula is derived as follows: based on $$ma = F = \Delta PS, \quad a = \frac{F}{m} = \frac{\Delta P W_1 h}{\rho V};$$

where $W_1 = W_b - 2x_1 \tan\frac{\theta}{2}$;

and $\Delta R = \rho \frac{\Delta x}{A} = \rho \frac{x_1}{A}, \quad x_1 = \frac{A}{\rho}\Delta R;$ $$a = \frac{F}{m} = \frac{\Delta P W_1 h}{\rho V} = \frac{\Delta P h}{\rho V}\left(W_b - 2x_1 \tan\frac{\theta}{2}\right) = \frac{\Delta P h}{\rho V}\left(W_b - 2\frac{A}{\rho}\Delta R \tan\frac{\theta}{2}\right);$$

where, $W_b$ is the width of the center of the diamond, $X_1$ is the distance from the center of the diamond to the position where the surface of the liquid metal droplet contacts the side wall of the diamond channel, and S is the cross section area of the diamond channel at $X_1$ position, and $S=W_1h$.

In another aspect, the disclosure provides a method for manufacturing the acceleration sensor, the method comprising:
1) preparing the upper base plate and the lower upper base plate;
2) forming diamond channels on the lower base plate through deep reactive ion etching, modifying a surface of the diamond channels using a sandblasting system to form a serrated micro convex structure on side walls of the diamond channels; depositing a chromium layer as an adhesive layer on a glass base plate using an electron beam evaporator, depositing a nickel layer on the chromium layer; with a photoresist as an etching mask, etching the nickel layer and the chromium layer using a wet etchant to obtain a nickel chromium alloy electrode;
3) placing the liquid metal 5 encapsulated in graphene in the center of the diamond channels, and bonding the upper base plate and the lower base plate using a curable adhesive, to produce the acceleration sensor; and
4) testing the acceleration sensor, and calibrating an acceleration value of the acceleration sensor.

Specifically, 4) is performed as follows:
4.1) measuring an initial resistance of each metal electrode of the acceleration sensor using a DC resistance meter; placing the acceleration sensor in a fixed position of a centrifugal testing device; the centrifugal testing device can accelerate a large number of test objects, calibrate multiple sensors at once, and monitor the movement of the liquid metal droplet in the diamond channel under high-speed cameras; the centrifugal testing device controls the rotational speed of the rotating plate and controls the rotational acceleration by using a speed controller;
4.2) controlling a rotational speed of a rotating plate of the centrifugal testing device, applying an acceleration from 0 to 2 g to the acceleration sensor, and synchronously recording resistance changes of the four metal electrodes, and monitoring a movement position of the liquid metal encapsulated in graphene in the diamond channel under a high-speed camera;
4.3) performing centrifugal experiments in two directions in sequence, applying different accelerations, and recording the resistance changes of the corresponding electrodes; and
4.4) based on collected experimental data, establishing a relationship between acceleration and the resistance changes of the metal electrodes, and calibrating a magnitude of acceleration using the resistance changes of the metal electrodes.

The acceleration sensor of the disclosure can be used to monitor the acceleration of rock masses during excavation and blasting in tunnels and underground chambers. By arranging a sensor node monitoring network and summarizing monitoring data at different nodes, the vibration acceleration of rock masses at different positions caused by tunnel excavation and blasting can be estimated.

It will be obvious to those skilled in the art that changes and modifications may be made, and therefore, the aim in the appended claims is to cover all such changes and modifications.

What is claimed is:

1. An acceleration sensor, comprising:
an upper base plate;
a lower base plate; and
a gallium-based liquid metal encapsulated in graphene;
wherein:
the lower base plate comprises a first surface comprising at least one diamond channel, and the upper base plate comprises a second surface comprising a metal electrode corresponding to the at least one diamond channel in position;
the liquid metal is disposed in a center of the at least one diamond channel; the first surface is bonded to the second surface through an adhesive;
the liquid metal is movable in the at least one diamond channel and is in electrical contact with the metal electrode of the upper base plate during movement.

2. The acceleration sensor of claim 1, wherein the lower base plate comprises two diamond channels arranged in a cross pattern, and the upper base plate comprises four metal electrodes distributed along a cross line of the cross pattern.

3. The acceleration sensor of claim 1, wherein the lower base plate is an acrylic plate, the upper base plate is borosilicate glass, and the metal electrode is a symmetrical zigzag nickel chromium conductive layer.

4. The acceleration sensor of claim 2, wherein the lower base plate is an acrylic plate, the upper base plate is borosilicate glass, and the metal electrode is a symmetrical zigzag nickel chromium conductive layer.

5. A method for manufacturing the acceleration sensor of claim 1, the method comprising:
1) preparing the upper base plate and the lower upper base plate;
2) forming diamond channels on the lower base plate through deep reactive ion etching, modifying a surface of the diamond channels using a sandblasting system to form a serrated micro convex structure on side walls of the diamond channels; depositing a chromium layer as an adhesive layer on a glass base plate using an electron beam evaporator, depositing a nickel layer on the chromium layer; with a photoresist as an etching mask, etching the nickel layer and the chromium layer using a wet etchant to obtain a nickel chromium alloy electrode;
3) placing the liquid metal 5 encapsulated in graphene in the center of the diamond channels, and bonding the upper base plate and the lower base plate using a curable adhesive, to produce the acceleration sensor; and
4) testing the acceleration sensor, and calibrating an acceleration value of the acceleration sensor.

6. The method of claim 5, wherein 4) is performed as follows:
4.1) measuring an initial resistance of each metal electrode of the acceleration sensor using a DC resistance meter; placing the acceleration sensor in a fixed position of a centrifugal testing device;
4.2) controlling a rotational speed of a rotating plate of the centrifugal testing device, applying an acceleration from 0 to 2 g to the acceleration sensor, and synchronously recording resistance changes of the four metal electrodes, and monitoring a movement position of the liquid metal encapsulated in graphene in the diamond channel under a high-speed camera;

4.3) performing centrifugal experiments in two directions in sequence, applying different accelerations, and recording the resistance changes of the corresponding electrodes; and 4.4) based on collected experimental data, establishing a relationship between acceleration and the resistance changes of the metal electrodes, and calibrating a magnitude of acceleration using the resistance changes of the metal electrodes.

* * * * *